United States Patent
Domeij

(10) Patent No.: US 9,685,550 B2
(45) Date of Patent: Jun. 20, 2017

(54) SILICON CARBIDE (SIC) DEVICE WITH IMPROVED GATE DIELECTRIC SHIELDING

(71) Applicant: FAIRCHILD SEMICONDUCTOR CORPORATION, San Jose, CA (US)

(72) Inventor: Martin Domeij, Sollentuna (SE)

(73) Assignee: Fairchild Semiconductor Corporation, San Jose, CA (US)

(*) Notice: Subject to any disclaimer, the term of this patent is extended or adjusted under 35 U.S.C. 154(b) by 0 days.

(21) Appl. No.: 14/980,708

(22) Filed: Dec. 28, 2015

(65) Prior Publication Data

US 2016/0190300 A1 Jun. 30, 2016

Related U.S. Application Data

(60) Provisional application No. 62/096,949, filed on Dec. 26, 2014.

(51) Int. Cl.
| | |
|---|---|
| *H01L 29/16* | (2006.01) |
| *H01L 29/78* | (2006.01) |
| *H01L 29/10* | (2006.01) |
| *H01L 29/06* | (2006.01) |

(52) U.S. Cl.
CPC ........ *H01L 29/7802* (2013.01); *H01L 29/063* (2013.01); *H01L 29/1095* (2013.01); *H01L 29/1608* (2013.01)

(58) Field of Classification Search
CPC ............. H01L 29/7802; H01L 29/1608; H01L 29/1095; H01L 29/063
See application file for complete search history.

(56) References Cited

U.S. PATENT DOCUMENTS

| | | | |
|---|---|---|---|
| 6,573,534 B1* | 6/2003 | Kumar | H01L 29/1608 257/328 |
| 7,528,040 B2* | 5/2009 | Das | H01L 29/0873 257/E21.066 |
| 8,143,094 B2 | 3/2012 | Tarui | |
| 8,492,827 B2 | 7/2013 | Ryu | |
| 8,558,244 B2* | 10/2013 | Yanase | H01L 21/046 257/77 |
| 8,933,466 B2* | 1/2015 | Uchida | H01L 27/0629 257/288 |
| 9,362,370 B2* | 6/2016 | Kudou | H01L 29/36 |

FOREIGN PATENT DOCUMENTS

WO 2014/105372 A1 7/2014

* cited by examiner

*Primary Examiner* — Thanh V Pham
(74) *Attorney, Agent, or Firm* — Brake Hughes Bellermann LLP

(57) ABSTRACT

In one general aspect, an apparatus can include a silicon carbide (SiC) device can include a gate dielectric, a first doped region having a first conductivity type, a body region of the first conductivity type, and a second doped region having a second conductivity type. The second doped region has a first portion disposed between the first doped region and the body region, and the second doped region has a second portion disposed between the first doped region and the gate dielectric.

20 Claims, 6 Drawing Sheets

US 9,685,550 B2

SILICON CARBIDE (SIC) DEVICE WITH IMPROVED GATE DIELECTRIC SHIELDING

RELATED APPLICATION

This application claims priority to and the benefit of U.S. Provisional Patent Application No. 62/096,949, filed on Dec. 26, 2014, and entitled "A Silicon Carbide (SiC) Device with Improved Gate Dielectric Shielding", which is incorporated herein by reference in its entirety.

TECHNICAL FIELD

This description relates to a silicon carbide (SiC) device with improved gate dielectric shielding.

BACKGROUND

Known devices in silicon carbide (SiC) are vulnerable to breakdown across a gate dielectric. Known solutions for handling this type of breakdown do not yield desirable results. Thus, a need exists for systems, methods, and apparatus to address the shortfalls of present technology and to provide other new and innovative features.

SUMMARY

In one general aspect, an apparatus can include a silicon carbide (SiC) device can include a gate dielectric, a first doped region having a first conductivity type, a body region of the first conductivity type, and a second doped region having a second conductivity type. The second doped region has a first portion disposed between the first doped region and the body region, and the second doped region has a second portion disposed between the first doped region and the gate dielectric.

The details of one or more implementations are set forth in the accompanying drawings and the description below. Other features will be apparent from the description and drawings, and from the claims.

DETAILED DESCRIPTION

Figure 1:
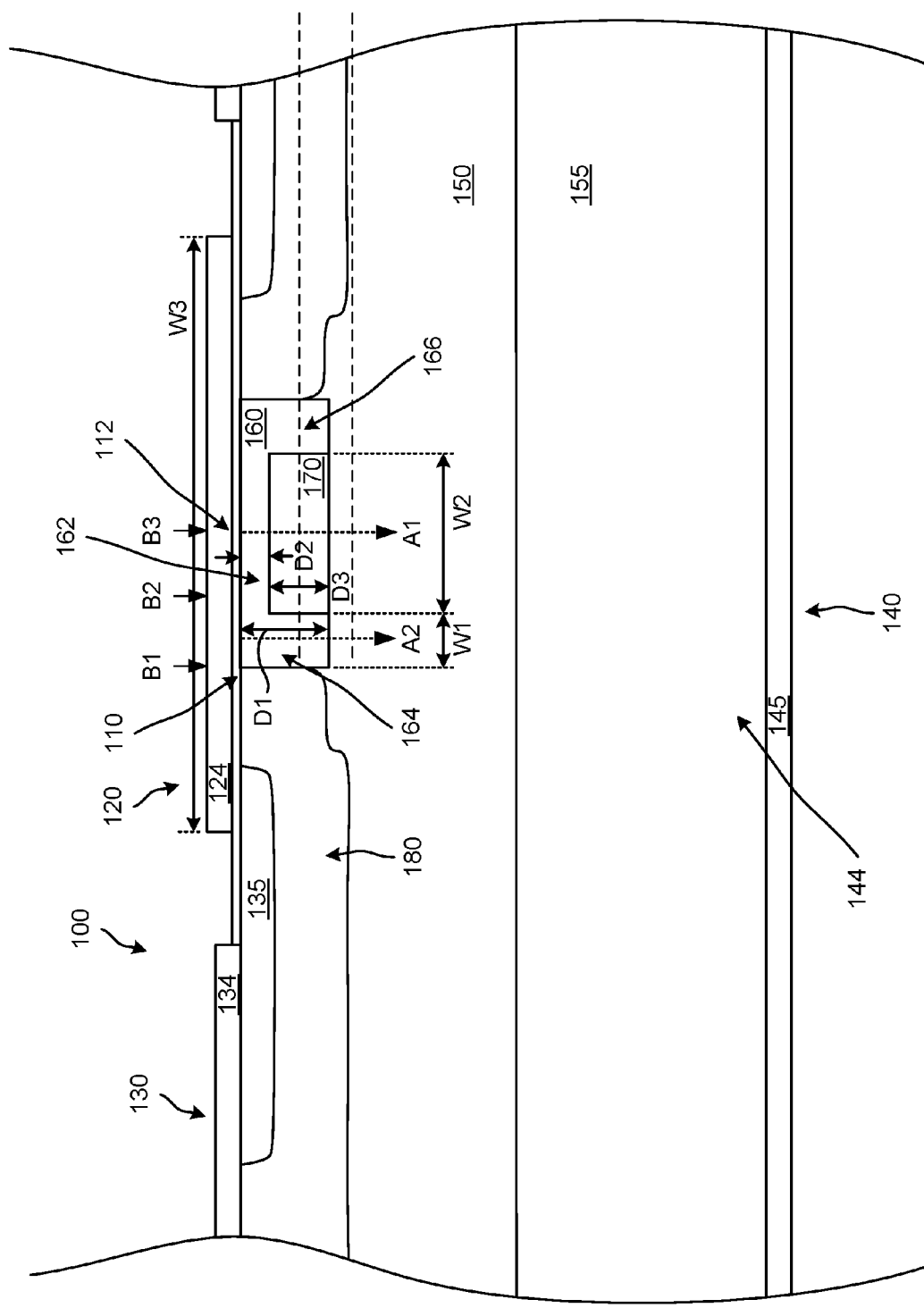
FIG. 1 is a diagram that illustrates a side cross-sectional view of a silicon carbide (SiC) device.

FIG. 1 is a diagram that illustrates a side cross-sectional view of a portion of a silicon carbide device 100 (which can be a SiC power device or a SiC high voltage device). The SiC device 100 includes features that enhance shielding of a gate dielectric 110 (e.g., a gate oxide (e.g., a thermal oxide, a deposited oxide), a high-K dielectric) of the SiC device 100. Accordingly, the SiC device 100 can be referred to as a Fully shielded Field Effect Transistor (FullFET). As shown in FIG. 1, the SiC device 100 includes a gate 120 (having a gate contact 124) disposed over the gate dielectric 110, a source 130 (which can include a source contact 134 and a source region 135). The SiC device 100 also includes a drain 140 (which can include a drain contact 144 and a drain region 145) disposed on a backside of the SiC device 100 such that an epitaxial layer 150 (also can be referred to as an epitaxial region or as a drain epitaxial) and/or a substrate 155 are disposed between the source 130 (or gate 120) and the drain 140. Although only some (or a portion) of the elements of the SiC device 100 are shown or labeled, the elements of the SiC device 100 are, or can be, mirrored.

As shown in FIG. 1, a P-type doped region 170 (which can be referred to as a P-type shield or P-type shield region) is disposed below the gate dielectric 110 such that an N-type doped region 160 has a first portion 162 disposed between the P-type doped region 170 and the gate dielectric 110. Also, a P-type body region 180 is included in the SiC device 100 such that an N-type doped region 160 has a second portion 164 disposed between the P-type body region 180 and the P-type doped region 170. A third portion 166, mirrored on the opposite side of the P-type doped region 170 relative to the second portion 164, is included in the N-type doped region 160. As shown in FIG. 1, the first portion 162 is horizontally aligned, or aligned along a direction that is the same as a direction along which the gate dielectric 110 or a top surface of the SiC device 100 is aligned. The second portion 164 is horizontally aligned or aligned along a direction between the source 130 (or gate 120) and the drain 140. In some implementations, a portion of the P-type doped region 170 may not be disposed or extend below or under (e.g., may be excluded from being below or under) the second portion 164 of the N-type doped region 160.

In some implementations, the SiC device 100 can be a relatively high voltage device operating at voltages greater than 400 V (e.g., 1000 V, 1200 V, 1500 V). In some implementations, the SiC device 100 can be a double-diffused metal-oxide-semiconductor (DMOS) device (e.g., vertical DMOS device).

In some implementations (and as shown in FIG. 1), a depth of the N-type doped region 160 can be approximately an equal depth as the P-type dope region 170 in the SiC device 100 (from a top of the epitaxial layer 150 or bottom surface of the gate dielectric 110). In some implementations, a depth of the N-type doped region 160 can be less than or greater than a depth as the P-type doped region 170 in the SiC device 100 (from a top of the epitaxial layer 150 or bottom surface of the gate dielectric 110).

As shown, a distance (e.g., a depth, a thickness) of the first portion 162 of the N-type doped region 160 is greater than a distance D2 (e.g., a depth, a thickness) of the second portion 164 of the N-type doped region 160. In some implementations, the depth D1 of the first portion 162 is greater than the distance D2 of the second portion 164. In some implementations, a ratio of the distance D1 to the distance D2 can be greater than 1 (e.g., 1.5:1, 2:1, 3:1, 4:1, 5:1, etc.). In some implementations, a distance D3 (e.g., a depth, a thickness) of the P-type doped region 170 is greater than the distance D2 of the first portion 162.

In some implementations, the first portion 162 has a top surface in contact with a bottom surface of the gate dielectric 110. In some implementations, the second portion 164 has a top surface in contact with a bottom surface of the gate dielectric 110. In some implementations, the first portion 162 can have a top surface disposed within a same plane as a top surface of the second portion 164. In some implementations, the first portion 162 and the second portion 164 can each have a top surface aligned with (or disposed within a same plane as) a top surface of the P-type body region 180.

As shown, a width W1 of the second portion 164 of the N-type doped region 160 is less than a width W2 of the P-type doped region 170. In some implementations, the width W1 of the second portion 164 of the N-type doped region 160 is equal to half of the width W2 of the P-type doped region 170. In some implementations, the width W1 of the second portion 164 of the N-type doped region 160 is greater than or less than half of the width W2 of the P-type doped region 170.

In some implementations, the width W1 and/or W2 can be less than 1 μm (e.g., 0.25 μm, 0.5 μm) or can be greater than 1 μm (e.g., 2 μm, 5 μm). As shown in FIG. 1, a width W3 of the gate contact 124 can be greater than the width W1 and/or the width W2. The width W3 can be a micron or more (e.g., 2 μm, 5 μm, 10 μm,).

As shown in FIG. 1, the gate contact 124 and gate dielectric 110 extend over the source region 135. In some implementations, the gate dielectric 110 can be aligned along a plane. A doping concentration of P-type doped region 170 can have a concentration higher than a doping concentration of the second portion 164 of the N-type doped region 160. In some implementations, the SiC device 100 can exclude a buried channel.

Although not shown in FIG. 1, the elements of the portion of the SiC device 100 can be mirrored to form a larger device or included with other semiconductor devices. In other words, the portion of the SiC device 100 can be approximately a half-cell. Said differently, the portion of the SiC device 100 can be one side of a larger or complete SiC device. In some implementations, termination regions or structures can be included in the SiC device 100.

Although not shown explicitly in FIG. 1, in some implementations, the P-type doped region 170 can be electrically coupled to a source potential (e.g., a potential of the source 130). The P-type doped region 170 can be tied to a same potential as the P-type body region 180. In some implementations, the P-type doped region 170 can be electrically floating. In some implementations the P-type doped region 170 can have a doping concentration in the range of 1e18 to 1e19 cm$^{-3}$.

In some implementations, a shape of the N-type doped region 160 and/or of the P-type doped region 170 can be different than shown in FIG. 1. For example, at least a portion of the N-type doped region 160 and/or at least a portion of the P-type doped region 170 can have a circular shape, a triangular shape, can have curves or sloped portions, and/or so forth. In this implementation, the P-type doped region 170 has a box-shaped or rectangular-shaped profile. In some implementations, the N-type doped region 160 and/or the P-type doped region 170 can be included in a region of the SiC device 100 that can be referred to as a junction field-effect transistor (JFET) region.

In this implementation, a doping level (or doping concentration) of the N-type doped region 160 can be higher than a doping level (or doping concentration) in the epitaxial layer 150. In some implementations, the doping level of the N-type doped region 160 can be more than two times the doping level of the epitaxial layer 150.

In some implementations, manufacturing of the SiC device 100 can be facilitated by the doping level of the N-type doped region 160 being relatively high compared to the doping level of the epitaxial layer 150. The N-type doped region 160 can be formed using a doping process (e.g., an ion implant process or an epitaxial growth process). The N-type doped region 160 can be formed before or after formation of the gate dielectric 100. The P-type doped region 170 can be formed using a doping process (e.g., an ion implant process) through the first portion 162 of the N-type doped region 160. The relatively high dopant of the N-type doped region 160 can facilitate formation of a shape (e.g., a rectangular region) of the P-type doped region 170 and/or can ensure that the portion (e.g., the first portion 162) between the P-type doped region 170 and the gate dielectric 110 remains an N-type region. The P-type doped region 170 can be formed below (e.g., immediately below) a location of probability of high electric field (e.g., maximum electric field). The location of probability of relatively high electric field can be toward a center portion 112 or a middle portion of the gate dielectric 110.

In some implementations, a thickness (e.g., vertical thickness) of the epitaxial layer 150 can be several times (e.g., 5 times, 10 times, 20 times) smaller than a thickness of the substrate 155. In some implementations, a thickness of the epitaxial layer 150 can be a few microns (μm) (e.g., 5 μm, 10 μm, 20 μm) in thickness. In some implementations, a thickness of the substrate 155 can have a thickness of approximately 100 microns (μm) or more (e.g., 150 μm, 250 μm, 350 μm, 500 μm). In some implementations, the thickness of the epitaxial layer 150 can be less than a few microns and/or the thickness of the substrate 155 can be less than 100 microns.

The configuration of the N-type doped region 160 (e.g., relatively high doping level of the N-type doped region 160) in combination with the P-type doped region 170 (e.g., the P-type doped region 170 below the first portion 162 of the N-type doped region 160 and the gate dielectric 110) within the SiC device 100 shown in FIG. 1 can have several advantages. In some implementations, these features provide an additional degree of freedom for reducing the electric field (e.g., maximum electric field) in the gate dielectric 110 since the p-type doped region 170 is in relatively close proximity to the location of the high oxide electric field (e.g., below the gate dielectric 110 and separated from the gate dielectric 110 by the first portion 162 of the N-type doped region 170 and toward the center portion 112 (or middle portion) of the gate dielectric 110, which is on the far right side of the SiC device 100 shown in FIG. 1). In some implementations, these features can reduce relatively high E-fields that can be formed at (e.g., across, near) the gate dielectric 110 during operation of the SiC device 100 (e.g., during relatively high voltage blocking operation). In some implementations, these features can reduce on resistance of the SiC device 100 by reducing potential JFET effects. In some implementations, these features can reduce gate-to-drain capacitance, which can facilitate faster switching of the SiC device 100. In some implementations, these features can result in an improvement in the trade-off between on-resistance and maximum oxide electric field during high voltage blocking compared with known technologies.

In some implementations, the features of the SiC device 100 described herein can have advantages over shielding that may be implemented by, for example, deep P-type body regions (not shown). Also, the features of the SiC device 100 described herein can have advantages over interrupted or split gate configurations (not shown). Such interrupted gate configurations can introduce complexity (e.g., interrupted gate contacts or electrodes) and/or uncontrolled and undesirable surface potentials.

The conductivity types that are described in connection with FIG. 1, or any of the other figures described herein, can be reversed. In other words, regions that are doped with a P-type dopant can be exchanged for an N-type dopant, and regions that are doped with an N-type dopant can be exchanged for a P-type dopant.

In some implementations, the width W1 of the second portion 164 under the gate 124 can be particularly significant. For a given width W1 of the second portion 164 the N-type doping concentration for the second portion 164 can be defined. For a smaller width W1, a higher N-type doping concentration of the second portion 164 can be needed. Conversely, for a smaller width W1, a higher N-type doping concentration of the second portion 164 can be needed. More details regarding doping concentrations are shown and discussed in connection with at least FIGS. 2A through 3B.

Figure 2A:
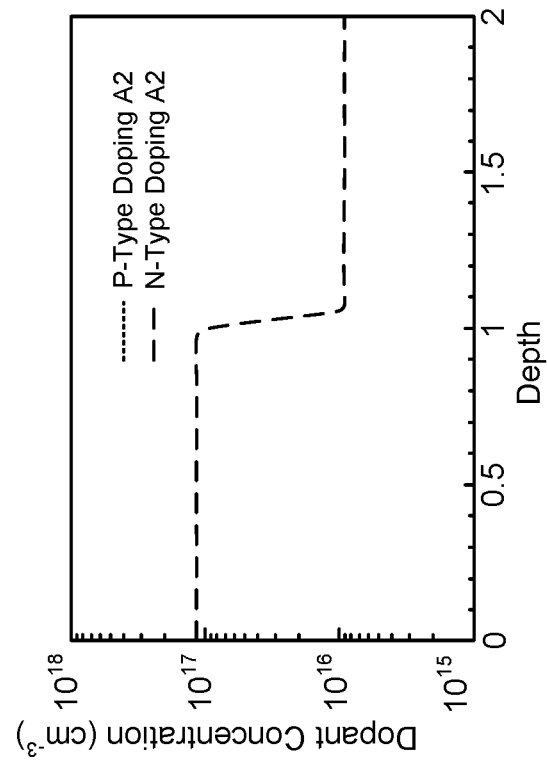
FIGS. 2A and 2B are graphs that illustrate doping concentrations along lines in FIG. 1.
Figure 2B:
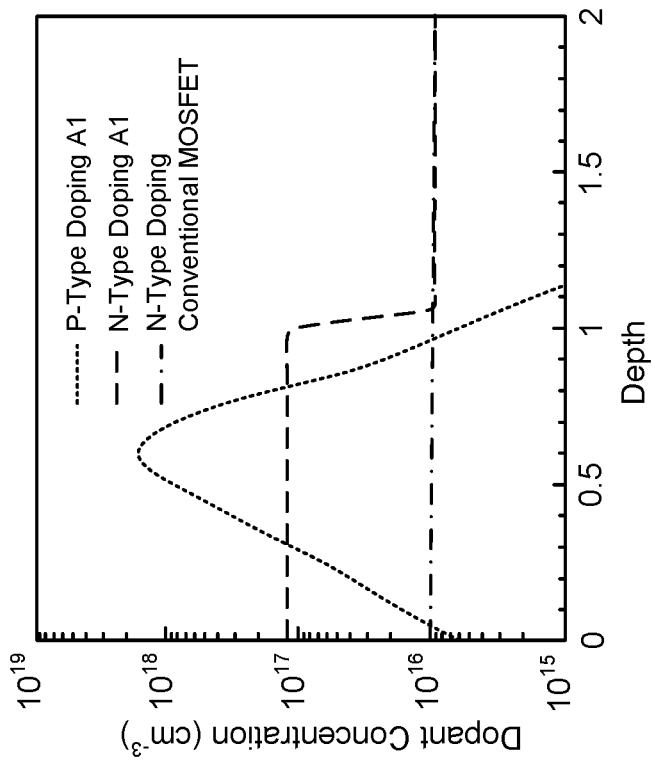

FIG. 2A is a graph that illustrates doping concentrations for P-type and N-type along line A1 in FIG. 1. FIG. 2B is a graph that illustrates doping concentrations for P-type and N-type along line A2 in FIG. 1. Although dimensionless in FIGS. 2A and 2B, the distances can be multiples of microns in some implementations.

In the graph shown in FIG. 2A, the P-type dopant concentration increases from a depth of 0 (e.g., 0 μm, or a multiple thereof) to a peak dopant concentration at approximately 0.6 (e.g., 0.6 μm, or a multiple thereof). In some implementations, the peak dopant concentration can be at a different depth. The N-type doping concentration is approximately at a constant level until a depth of approximately 1 (e.g., 1 μm, or a multiple thereof). The doping concentration within this SiC device 100 is contrasted with an N-type doping concentration in a typical MOSFET device.

As shown in FIG. 2A, the SiC device 100 has a buried P-doped region under the center of the gate (or gate dielectric 110) and N-type doped region 160 with increased dopant concentration above the P-type doped region 170 and extending to the channel and in a downward direction. The P-type doped region 170 reduces the maximum electric field in the gate dielectric 110 and the N-type doped region 160 reduces potential JFET effects. In some implementations, the P-type doped region 170 can be electrically coupled to the source 130 in relatively small die areas. This concept is discussed in more detail below.

FIG. 2B is a graph that illustrates doping concentrations for P-type and N-type along line A2 in FIG. 1. As shown in FIG. 2B, a P-type doping is excluded from (or negligible in) the second portion 164 of the N-type doped region 160 along line A2.

The doping concentration and depths in FIGS. 2A and 2B are illustrated by way of example only. In some implementations, concentration profiles, depths, and/or so forth can be different than shown in FIGS. 2A and 2B.

Figure 3B:
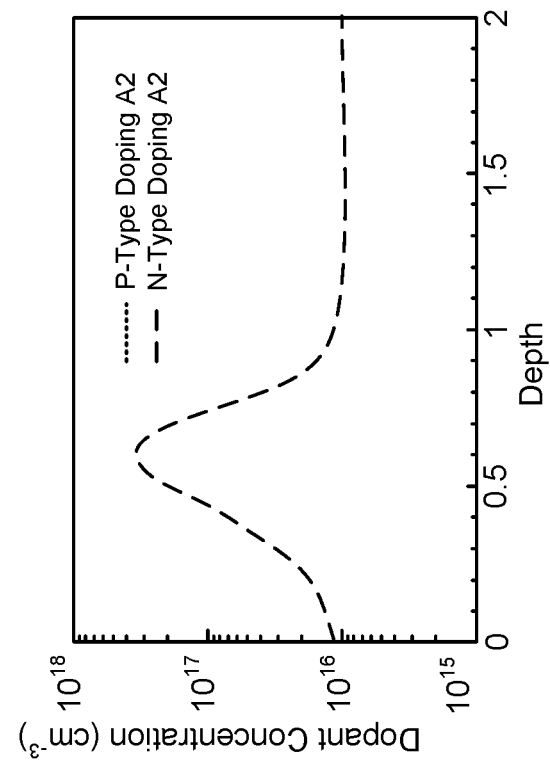
FIGS. 3A and 3B are additional graphs that illustrate doping concentrations along lines in FIG. 1.
Figure 3A:
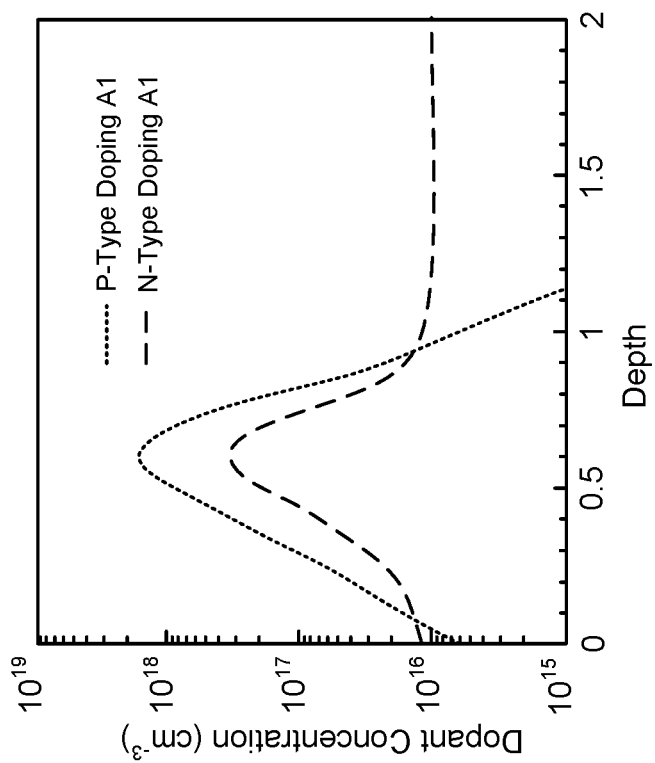

FIGS. 2A and 2B are graphs that illustrate N-type doping concentrations that are relatively (e.g., substantially) constant or uniform or linear along a depth direction. The P-type doping concentration is non-uniform (e.g., Gaussian). In some implementations, the P-type doping concentration can be relatively constant or uniform or linear. FIGS. 3A and 3B are graphs that illustrate an N-type doping concentration profile and/or a P-type doping concentration that are non-uniform or non-constant or non-linear along a depth direction.

FIG. 3A is an additional graph that illustrates doping concentrations for P-type and N-type along line A1 in FIG. 1. FIG. 3B is a graph that illustrates doping concentrations for P-type and N-type along line A2 in FIG. 1.

In graph shown in FIG. 3A, the P-type dopant concentration increases from a depth of 0 (e.g., 0 μm, or a multiple thereof) to a peak dopant concentration at approximately 0.6 (e.g., 0.6 μm, or a multiple thereof). The N-type doping concentration increases from a depth of 0 (e.g., 0 μm, or a multiple thereof) to a peak dopant concentration at approximately 0.6 (e.g., 0.6 μm, or a multiple thereof). In some implementations, the peak for the N-type doping or the peak for the P-type doping can be aligned as shown, or can be different. Accordingly, the net doping concentration along A1 can be relatively (e.g., substantially) constant or uniform or linear along the depth direction. In some implementations, the net doping concentration along A1 can be at a relatively uniform N-type doping concentration of approximately 1e16 cm$^{-3}$ for the drain and JFET region of, for example, a 1200 V SiC MOSFET device. The doping concentration within this SiC device 100 is contrasted with an N-type doping concentration in a typical MOSFET device.

As shown in FIG. 3A, the SiC device 100 has a buried P-doped region under the center of the gate (or gate dielectric 110) and N-type doped region 160 with increased dopant concentration above the P-type doped region 170 and extending to the channel and in a downward direction. The P-type doped region 170 reduces the maximum electric field in the gate dielectric 110 and the N-type doped region 160 reduces potential JFET effects. In some implementations, the P-type dope region 170 can be electrically coupled to the source 130 in relatively small die areas. This concept is discussed in more detail below.

FIG. 3B is an additional graph that illustrates doping concentrations for P-type and N-type along line A2 in FIG. 1. As shown in FIG. 3B, a P-type doping is excluded from (or negligible in) the second portion 164 of the N-type doped region 160 along line A2.

Figure 4A:
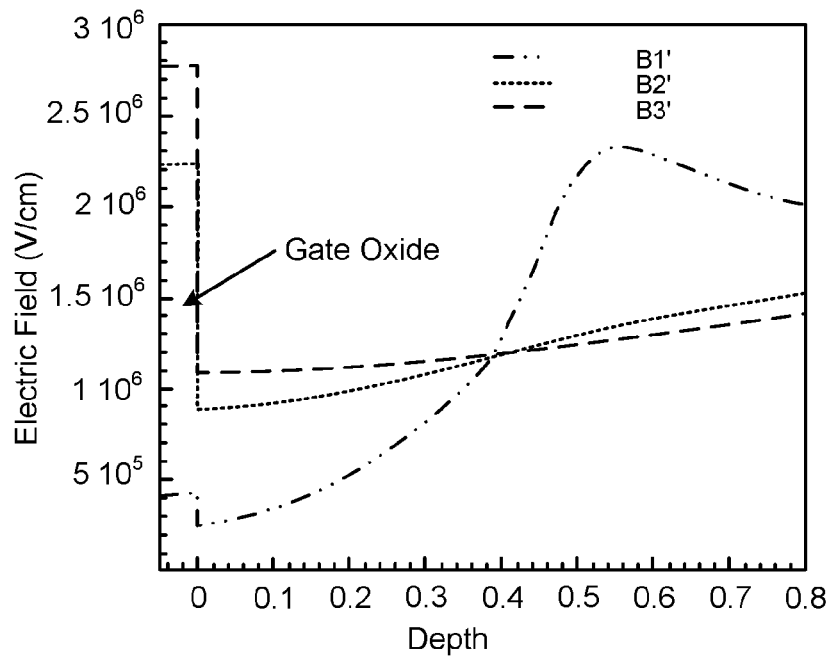
FIGS. 4A and 4B are graphs that illustrate electric fields included in devices.
Figure 4B:
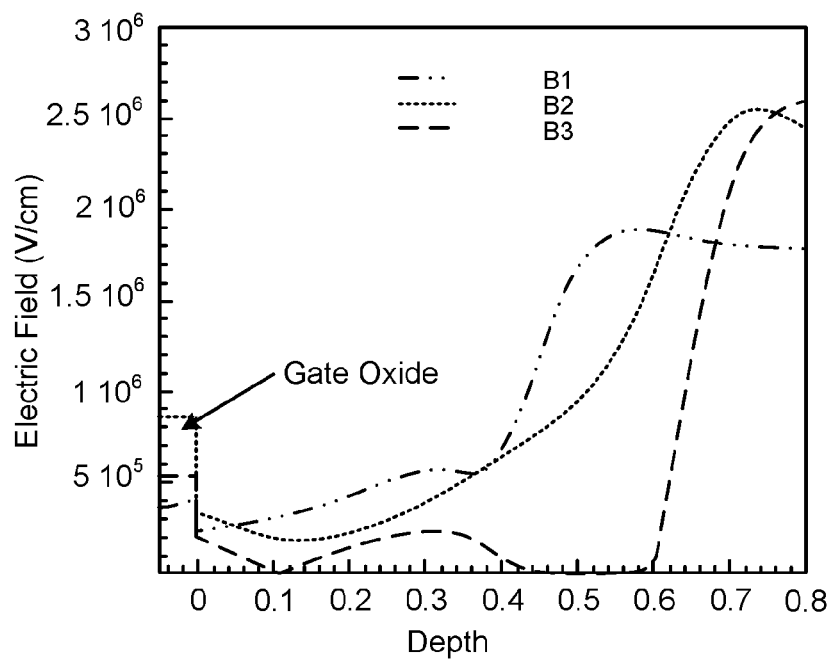

FIG. 4A is a graph that illustrates electric fields within an example MOSFET device, and FIG. 4B is a graph that illustrates electric fields within a SiC devices described herein. Although dimensionless in FIGS. 4A and 4B, the distances can be multiples of microns in some implementations. In these graphs, distances illustrated on the x-axis in microns and electric field is illustrated on the y-axis in volts per centimeter. The drain to source voltage for both is the same at approximately 1200 V.

The electric fields shown in FIG. 4B correspond with points B1 (at approximately the right edge of the P-type body region 180), B2, and B3 (at approximately the center of the gate 120) along the MOS gate illustrated in FIG. 2A. In some implementations, the P-type doped region 170 can have a half-cell width of approximately 500 nm (full width of approximately 1 micron). The electric fields shown in FIG. 4A correspond with locations B1', B2', and B3' in a MOS gate in a conventional MOSFET device (not shown and without the additional features described herein) with dimensions similar to the MOS gate of the SiC device 100 illustrated in FIG. 1. These graphs are presented by way of example only, and different profiles and dimensions may be used in different device configurations.

As shown in FIG. 4A, a maximum electric field in the MOSFET device is at approximately a center portion (e.g., location B3') of the MOS gate of the MOSFET device. As shown in FIG. 4B, a maximum electric field in the SiC device 100 is approximately at location B2 of the SiC device 100 (e.g., which is at approximately a left edge of the P-type doped region 170).

Figure 5A:
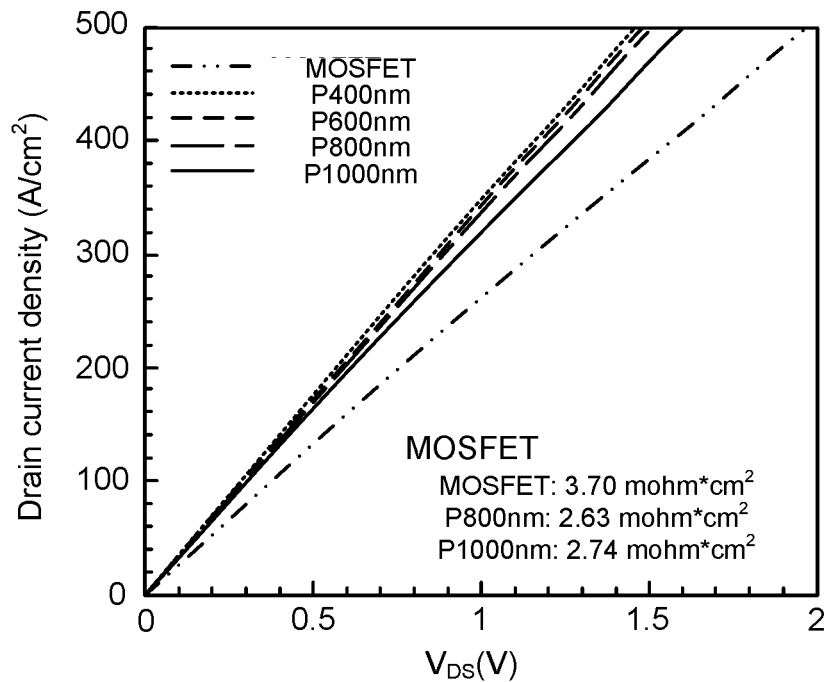
FIGS. 5A and 5B are diagrams that illustrate, respectively, drain current density and maximum electric field versus drain to source voltage.
Figure 5B:
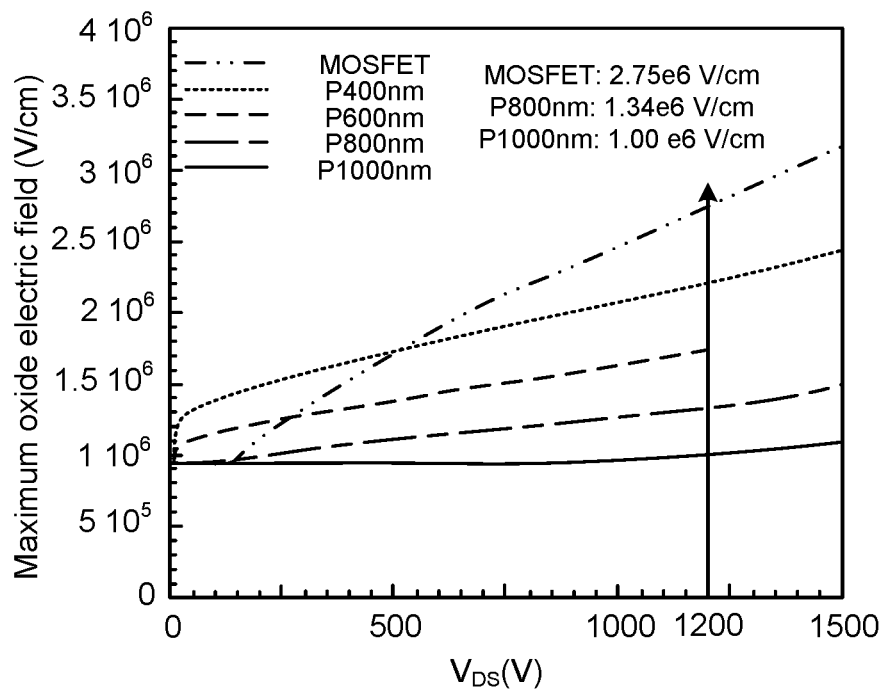

FIGS. 5A and 5B are diagrams that illustrate, respectively, drain current density (A/cm$^2$) and maximum electric field (V/cm) versus drain to source voltage (V) for variations of the SiC device 100 shown in FIG. 1 compared with a corresponding MOSFET device (not shown). As illustrated in FIG. 5A, the SiC device 100 with a 1000 nm wide P-type doped region 170 has approximately a 25% reduced on-resistance compared to a MOSFET device. As illustrated in FIG. 5B, the SiC device 100 with a 1000 nm wide P-type doped region 170 has approximately a 64% reduced maximum electric field in gate oxide compared to a MOSFET device.

The on-resistance of the SiC device 100 changes a relatively small amount in response to the width of the P-type doped region 170. This effect can be because the JFET resistance is reduced to a relatively low level. The gate-drain capacitance is reduced for the SiC device 100 compared to the MOSFET device. Although illustrated as having specific characteristics (e.g., dimensions), various characteristics can be implemented. The specific characteristics are presented by way of example only.

Figure 6:
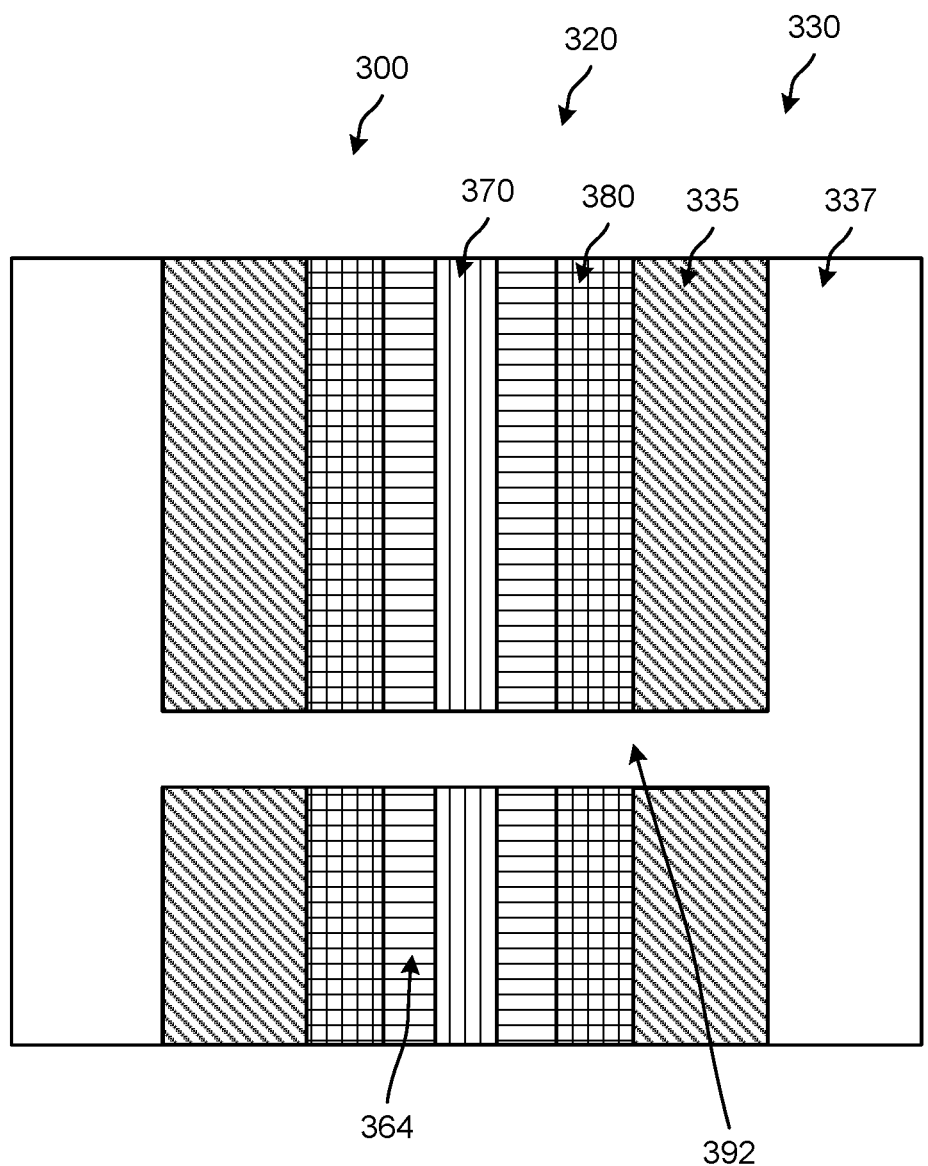
FIG. 6 is a top cross-sectional view of a SiC device.

FIG. 6 is a top cross-sectional view of a SiC device 300. As shown in FIG. 6, the SiC device 300 includes an N-type doped region 364 (which can correspond to the second portion 164 of the N-type doped region 160) disposed between the P-type doped region 370 and a P-type body region 380. The SiC device 300 includes a source region 335 and a P+ region 337 (which are associated with a source 330). The P+ region 337 is coupled to (e.g., electrically or conductively coupled to) the P-type doped region 370 by a connection portion 392.

The P-type doped region 370 can be coupled to the P+ region 337 and source region 335 at various places along the SiC device 300. The gate 320 (but not the gate electrode) may be interrupted at various places such that the P-type doped region 370 may be coupled to the source 330. In some implementations, approximately 5-10% or less of the SiC device 300 may be used to make connections between the P-type doped region 370 and the source 330. In some implementations, no low-resistive path and/or high direct-current (DC) capable metal connection may be needed for the p-type doped region 370.

Although the behavior of the circuits shown and described in the graphs herein as making transitions at specified voltages and at specified times, when implemented, the transitions of components may occur slightly before or slightly after the specified voltages, specified times, and/or so forth. Specifically, variations in threshold voltages, processing variations, temperature variations, switching speeds of devices, circuit transition delays, and/or so forth can result in conditions (e.g., non-ideal conditions) that can trigger transitions of components slightly before or slightly after the specified voltages, times, and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various devices (e.g., SiC device 100, and so forth) described herein can be included in a variety of devices or systems such as, for example, an electronic device. The electronic device can be, or can include, for example, a laptop-type device with a traditional laptop-type form factor. In some implementations, the electronic device can be, or can include, for example, a wired device and/or a wireless device (e.g., Wi-Fi enabled device), a computing entity (e.g., a personal computing device), a server device (e.g., a web server), a mobile phone, an audio device, a motor control device, a power supply (e.g., an off-line power supply), a personal digital assistant (PDA), a tablet device, e-reader, a television, an automobile, and/or so forth. In some implementations, the electronic device can be, or can include, for example, a display device (e.g., a liquid crystal display (LCD) monitor, for displaying information to the user), a keyboard, a pointing device (e.g., a mouse, a trackpad, by which the user can provide input to the computer).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
a silicon carbide (SiC) device can include a gate dielectric;
a first doped region having a first conductivity type;
a source;
a body region of the first conductivity type; and
a second doped region having a second conductivity type, the second doped region having a first portion disposed between the first doped region and the body region, the second doped region having a second portion disposed between the first doped region and the gate dielectric, the first doped region being under the gate dielectric.

2. The apparatus of claim 1, wherein the first portion of the second doped region is aligned horizontally between the body region and the first doped region, and the second portion of the second doped region is aligned vertically between the gate dielectric and the first doped region.

3. The apparatus of claim 1, wherein the first portion of the second doped region is contiguous with the second portion of the second doped region.

4. The apparatus of claim 1, wherein the SiC device can include an epitaxial layer of the second conductivity type, and the second portion of the second doped region is included in a junction field-effect transistor (JFET) region.

5. The apparatus of claim 4, wherein the second portion of the second doped region has a doping concentration greater than a doping concentration of the epitaxial layer.

6. The apparatus of claim 1, wherein the first doped region is coupled to a source potential.

7. The apparatus of claim 1, wherein the first doped region is floating.

8. The apparatus of claim 1, wherein the body region is a first body region on a first side of a gate,
the apparatus, further comprising:
a second body region disposed on a second side of the gate, the second doped region having a third portion disposed between the first doped region and the second body region.

9. The apparatus of claim 8, wherein the third portion of the second doped region is aligned horizontally between the second body region and the first doped region.

10. The apparatus of claim 8, wherein the first portion of the second doped region is contiguous with the second portion of the second doped region and the third portion of the second doped region.

11. The apparatus of claim 1, wherein the first portion is formed using an ion implantation process.

12. An apparatus, comprising:
a silicon carbide (SiC) device can include a gate dielectric;
a first doped region having a first conductivity type;
a body region;
a source region; and
a second doped region having a second conductivity type, the second doped region having a first portion disposed between the first doped region and the source region, the second doped region having a second portion disposed between the first doped region and the gate dielectric, the first portion having a substantially constant net doping concentration along a depth direction, the first doped region being under the gate dielectric.

13. The apparatus of claim 12, wherein the first portion of the second doped region is aligned horizontally between the source region and the first doped region, and the second portion of the second doped region is aligned vertically between the gate dielectric and the first doped region.

14. The apparatus of claim 12, wherein the first portion of the second doped region is contiguous with the second portion of the second doped region.

15. The apparatus of claim 12, wherein the SiC device can include an epitaxial layer of the second conductivity type, and the second portion of the second doped region is included in a junction field-effect transistor (JFET) region.

16. The apparatus of claim 15, wherein the second portion of the second doped region has a doping concentration greater than a doping concentration of the epitaxial layer.

17. The apparatus of claim 12, wherein the first doped region is coupled to a source potential.

18. The apparatus of claim 12, wherein the first doped region is floating.

19. The apparatus of claim 12, wherein the body region is a first body region on a first side of a gate,
the apparatus, further comprising:
a second body region disposed on a second side of the gate, the second doped region having a third portion disposed between the first doped region and the second body region.

20. The apparatus of claim 19, wherein the third portion of the second doped region is aligned horizontally between the second body region and the first doped region.

* * * * *